(12) United States Patent  
Sai (10) Patent No.: US 8,115,257 B2  
(45) Date of Patent: Feb. 14, 2012

(54) SEMICONDUCTOR APPARATUS (75) Inventor: Hideaki Sai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/956,248

(22) Filed: Nov. 30, 2010

(65) Prior Publication Data

US 2011/0073949 A1 Mar. 31, 2011

Related U.S. Application Data

(62) Division of application No. 12/127,907, filed on May 28, 2008, now Pat. No. 7,863,687.

(30) Foreign Application Priority Data

Jun. 5, 2007 (JP) .................................. 2007-149481

(51) Int. Cl.
*H01L 21/70* (2006.01)
(52) U.S. Cl. ........ 257/369; 257/202; 257/203; 257/357; 257/358; 257/E29.242; 257/E29.256
(58) Field of Classification Search .......... 257/202–203, 257/207, 210, 357–358, 369, 499, 784; 361/90
See application file for complete search history.

(56) References Cited

U.S. PATENT DOCUMENTS

| | | |
|---|---|---|
| 6,169,311 B1 | 1/2001 | Iwasaki |
| 6,222,213 B1 | 4/2001 | Fujiwara |
| 6,943,412 B1 | 9/2005 | Horiguchi |
| 2004/0195625 A1 | 10/2004 | Ichikawa |

(Continued)

FOREIGN PATENT DOCUMENTS

JP 05-003173 1/1993

(Continued)

OTHER PUBLICATIONS

Japanese Office Action corresponding to U.S. Appl. No. 12/127,907 mailed Jun. 29, 2009.

(Continued)

*Primary Examiner* — A. Sefer
(74) *Attorney, Agent, or Firm* — Turocy & Watson, LLP (57) ABSTRACT

A semiconductor apparatus includes an internal circuit, a CMOS composed of a P-channel MOS transistor with a source connected to a high-potential power supply line and a gate connected to the internal circuit, and an N-channel MOS transistor with a source connected to a low-potential power supply line and a gate connected to the internal circuit, an output terminal connected to a drain of the P-channel MOS transistor and a drain of the N-channel MOS transistor and a protection transistor with a source and a gate connected to one power supply line of the high-potential power supply line and the low-potential power supply line and a drain connected to the output terminal, a conductivity type of the protection transistor being the same as a conductivity type of one MOS transistor of the P-channel MOS transistor and the N-channel MOS transistor, the source of the one MOS transistor being connected to the one power supply line. Resistance of a current path extending from the output terminal through the one MOS transistor to the one power supply line has a value such that, when a voltage at which the protection transistor causes snapback is applied between the output terminal and the one power supply line, a current flowing through the current path is lower than a breakdown current of the one MOS transistor.

5 Claims, 9 Drawing Sheets

U.S. PATENT DOCUMENTS

| | | | |
|---|---|---|---|
| 2005/0174707 A1* | 8/2005 | Ker et al. | 361/56 |
| 2007/0025033 A1* | 2/2007 | Ouchiyama | 361/56 |
| 2009/0091870 A1 | 4/2009 | Huang et al. | |

FOREIGN PATENT DOCUMENTS

| | | |
|---|---|---|
| JP | 2001-060663 | 3/2001 |
| JP | 2001-339049 | 12/2001 |
| JP | 2005-183661 | 7/2005 |
| JP | 2006-332144 | 12/2006 |
| JP | 2007-096211 | 4/2007 |

OTHER PUBLICATIONS

U.S. Office Action dated Mar. 25, 2010 corresponding the U.S. Appl. No. 12/127,907, filed May 28, 2008.

* cited by examiner

SEMICONDUCTOR APPARATUS

CROSS-REFERENCE TO RELATED APPLICATIONS

This application is a Division of application Ser. No. 12/127,907 filed May 28, 2008; the entire contents of which are incorporated herein by reference.

This application is based upon and claims the benefit of priority from the prior Japanese Patent Application No. 2007-149481, filed on Jun. 5, 2007; the entire contents of which are incorporated herein by reference.

BACKGROUND OF THE INVENTION

1. Field of the Invention

This invention relates to a semiconductor apparatus, and more particularly to a semiconductor apparatus including an output CMOS (complementary metal oxide semiconductor) circuit.

2. Background Art

As conventionally known in the art, in a semiconductor apparatus, a CMOS circuit can be provided as an output circuit for externally extracting an output signal of the internal circuit. The CMOS circuit comprises a P-channel MOSFET (metal oxide semiconductor field effect transistor) and an N-channel MOSFET. The source of the P-channel MOSFET is connected to the high-potential power supply line (VDD) of the semiconductor apparatus, and the source of the N-channel MOSFET is connected to the low-potential power supply line (VSS). The output signal of the internal circuit is applied to the gates of these MOSFETs, and their drains are connected to the output terminal of the semiconductor apparatus. Thus, in response to the output signal of the internal circuit, the VDD potential or the VSS potential is applied to the output terminal (see, e.g., JP-A H5-003173(Kokai) (FIG. 11)).

In such a semiconductor apparatus, to protect a MOSFET of the CMOS circuit from ESD (electrostatic discharge) applied to the output terminal, an ESD protection device can be connected in parallel to the MOSFET between the output terminal and the high-potential power supply line or between the output terminal and the low-potential power supply line, as also known in the art. This ESD protection device is illustratively based on a MOSFET. For example, to protect the N-channel MOSFET (hereinafter referred to as "output NMOS") constituting the CMOS circuit, an N-channel MOSFET (hereinafter referred to as "protection NMOS") is connected in parallel to this output NMOS between the output terminal and the low-potential power supply line. The gate of this protection NMOS is connected to the low-potential power supply line so that the protection NMOS is normally on and is turned off upon application of ESD to the output terminal (see, e.g., JP-A 2007-096211(Kokai) (FIG. 9)).

However, this type of semiconductor apparatus has the following problem. The gate of the protection NMOS is constantly subjected to the potential of the low-potential power supply (VSS potential), and is completely in the OFF state. In contrast, the gate of the output NMOS is subjected to an indefinite potential between the VDD potential and the VSS potential by the internal circuit, and hence induces a channel as compared with the protection NMOS. Hence the drain-source voltage for turning on the output NMOS is lower than the drain-source voltage for turning off the protection NMOS. Thus, upon application of ESD to the output terminal, the output NMOS is turned on earlier than the protection NMOS, and the flow of ESD current unfortunately concentrates on the output NMOS. Hence, simply connecting the protection NMOS in parallel to the output NMOS does not achieve a sufficient protection effect. Depending on the magnitude of the applied ESD current, the output NMOS may be broken down.

SUMMARY OF THE INVENTION

According to an aspect of the invention, there is provided a semiconductor apparatus including: an internal circuit; a CMOS composed of a P-channel MOS transistor with a source connected to a high-potential power supply line and a gate connected to the internal circuit, and an N-channel MOS transistor with a source connected to a low-potential power supply line and a gate connected to the internal circuit; an output terminal connected to a drain of the P-channel MOS transistor and a drain of the N-channel MOS transistor; and a protection transistor with a source and a gate connected to one power supply line of the high-potential power supply line and the low-potential power supply line and a drain connected to the output terminal, a conductivity type of the protection transistor being the same as a conductivity type of one MOS transistor of the P-channel MOS transistor and the N-channel MOS transistor, the source of the one MOS transistor being connected to the one power supply line, resistance of a current path extending from the output terminal through the one MOS transistor to the one power supply line having a value such that, when a voltage at which the protection transistor causes snapback is applied between the output terminal and the one power supply line, a current flowing through the current path is lower than a breakdown current of the one MOS transistor.

According to another aspect of the invention, there is provided a semiconductor apparatus including: an internal circuit; a CMOS composed of a P-channel MOS transistor with a source connected to a high-potential power supply line and a gate connected to the internal circuit, and an N-channel MOS transistor with a source connected to a low-potential power supply line and a gate connected to the internal circuit; an output terminal connected to a drain of the P-channel MOS transistor and a drain of the N-channel MOS transistor; and a protection transistor with a source and a gate connected to the low-potential power supply line and a drain connected to the output terminal, a conductivity type of the protection transistor being an N-channel type, resistance of a current path extending from the output terminal through the N-channel MOS transistor to the low-potential power supply line having a value such that, when voltage at which the protection transistor causes snapback is applied between the output terminal and the low-potential power supply line, a current flowing through the current path is lower than a breakdown current of the N-channel MOS transistor.

According to another aspect of the invention, there is provided a semiconductor apparatus including: an internal circuit; a CMOS composed of a P-channel MOS transistor with a source connected to a high-potential power supply line and a gate connected to the internal circuit, and an N-channel MOS transistor with a source connected to a low-potential power supply line and a gate connected to the internal circuit; an output terminal connected to a drain of the P-channel MOS transistor and a drain of the N-channel MOS transistor; and a protection transistor with a source and a gate connected to the high-potential power supply line and a drain connected to the output terminal, a conductivity type of the protection transistor being an P-channel type, resistance of a current path extending from the output terminal through the P-channel MOS transistor to the high-potential power supply line having a value such that, when voltage at which the protection transistor causes snapback is applied between the output terminal and the high-potential power supply line, a current flowing through the current path is lower than a breakdown current of the P-channel MOS transistor.

DETAILED DESCRIPTION OF THE INVENTION

Embodiments of the invention will now be described with reference to the drawings, starting with a first embodiment of the invention.

Figure 1:
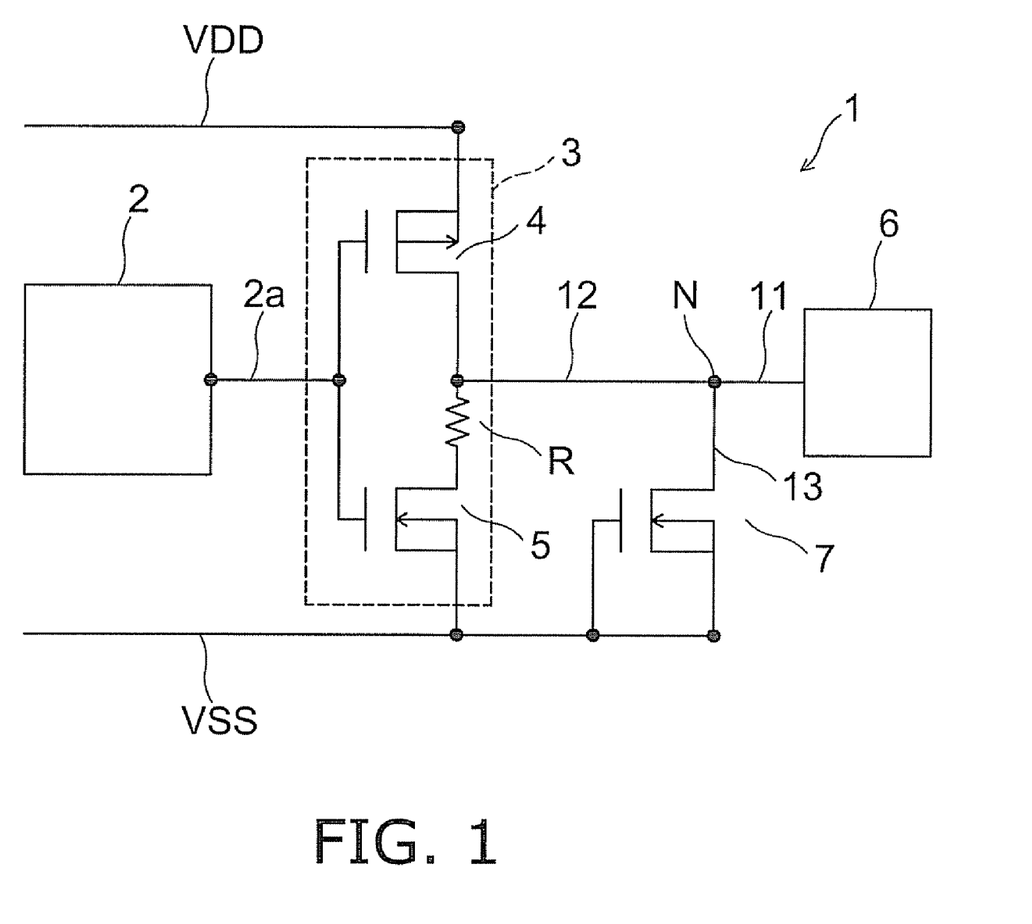
FIG. 1 is a circuit diagram illustrating a semiconductor apparatus according to a first embodiment of the invention.

FIG. 1 is a circuit diagram illustrating a semiconductor apparatus according to the present embodiment.

Figure 2A:
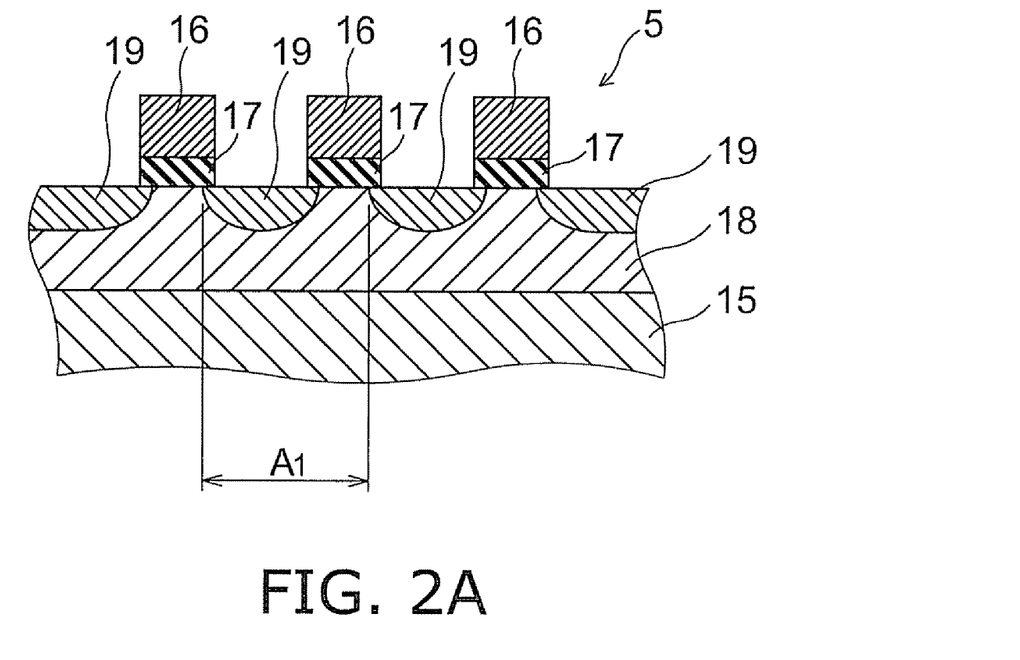
FIG. 2A is a cross-sectional view illustrating an output MOS.
Figure 2B:
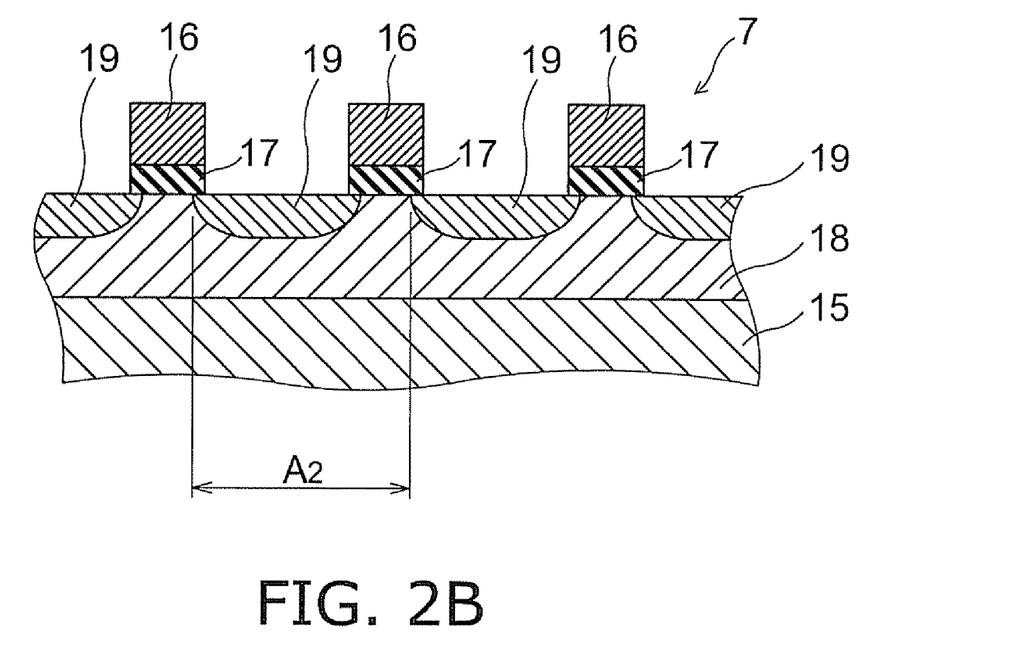
FIG. 2B is a cross-sectional view illustrating a protection MOS.

FIG. 2A is a cross-sectional view illustrating an output MOS, and FIG. 2B is a cross-sectional view illustrating a protection MOS.

Figure 3:
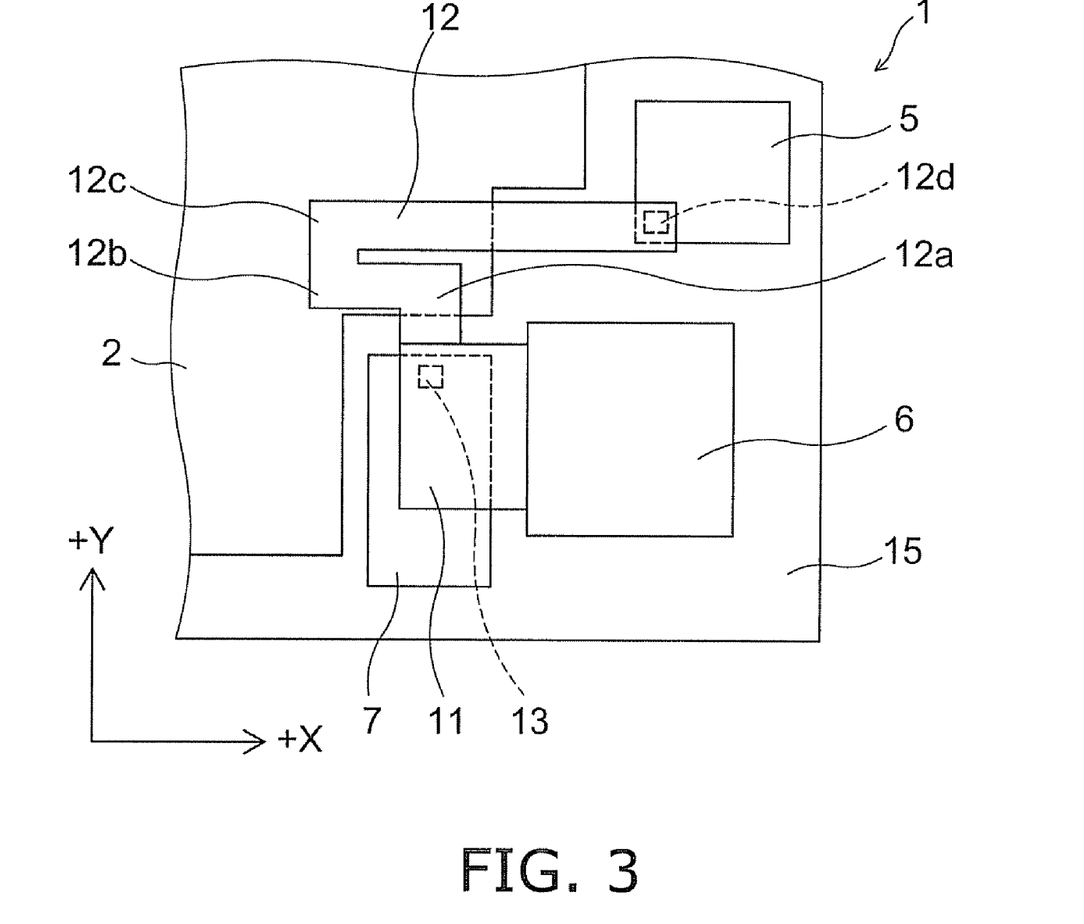
FIG. 3 is a plan view illustrating the semiconductor apparatus according to the first embodiment.

FIG. 3 is a plan view illustrating this semiconductor apparatus.

As shown in FIG. 1, the semiconductor apparatus 1 according to the present embodiment includes an internal circuit 2. The internal circuit 2 provides the intended functions of the semiconductor apparatus 1, and is illustratively composed of a logic circuit for calculation and a memory for storing data. Furthermore, the semiconductor apparatus 1 includes a high-potential power supply line VDD and a low-potential power supply line VSS for supplying the internal circuit 2 with the potential of the high-potential and low-potential power supply, respectively.

Furthermore, the semiconductor apparatus 1 includes a CMOS 3 serving as an output circuit for externally extracting an output signal of the internal circuit 2. The CMOS 3 includes a P-channel MOSFET (hereinafter referred to as "PMOS") 4 and an N-channel MOSFET (hereinafter referred to as "NMOS") 5. The drain of the PMOS 4 and the drain of the NMOS 5 are connected to each other. The gate of the PMOS 4 and the gate of the NMOS 5 are connected to an output line 2a of the internal circuit 2. The source of the PMOS 4 is connected to the high-potential power supply line VDD, and the source of the NMOS 5 is connected to the low-potential power supply line VSS.

Moreover, the semiconductor apparatus 1 includes an output pad 6 serving as an output terminal. The output pad 6 is connected to the drain of the PMOS 4 and the drain of the NMOS 5 through lines 11 and 12. The output terminal is not limited to the implementation as a pad, but any other implementation can be used as long as the output signal of the internal circuit 2 can be extracted outside the semiconductor apparatus 1.

Furthermore, the semiconductor apparatus 1 includes a protective N-channel MOSFET (hereinafter referred to as "protection NMOS") 7. The source and the gate of the protection NMOS 7 are connected to the low-potential power supply line VSS, and its drain is connected to the output pad 6 through lines 13 and 11. More specifically, the line 11 extracted from the output pad 6 is split at the node N into the line 12 and the line 13. The line 12 is connected to the drain of the PMOS 4 and the drain of the NMOS 5, and the line 13 is connected to the drain of the protection NMOS 7. Thus the protection NMOS 7 is connected in parallel to the NMOS 5 between the output pad 6 and the low-potential power supply line VSS.

As shown in FIGS. 2A and 2B, in the output NMOS 5 and the protection NMOS 7, a plurality of striped gate electrodes 16 are provided in parallel to each other on a silicon substrate 15, which serves as the substrate of the semiconductor apparatus 1. A gate insulating film 17 is formed between the silicon substrate 15 and the gate electrode 16. A P-type well 18 is formed in the upper surface of the silicon substrate 15. An N-type region 19 is formed in the region of the P-type well 18 located between the directly underlying areas of the gate electrodes 16. In the NMOS 5 and the protection NMOS 7, the N-type region 19 serves as a source region or a drain region, and the region of the P-type well 18 located between the N-type regions 19 serves as a channel region. The drain-source spacing $A_1$ in the NMOS 5, that is, the array pitch of the N-type regions 19, is smaller than the drain-source spacing $A_2$ in the protection NMOS 7. This is because the drain-source parasitic resistance in the NMOS 5 is minimized to improve the current driving performance of the NMOS 5.

Next, the planar layout of the semiconductor apparatus 1 is described with reference to FIG. 3, where XY orthogonal coordinates are defined for convenience of description.

As shown in FIG. 3, in the semiconductor apparatus 1, the output pad 6 is placed at the +X, −Y corner of the chip. As viewed from above the upper surface of the semiconductor apparatus 1, the output pad 6 is illustratively shaped like a square. The output pad 6 is formed at the top of the multilevel interconnect layer (not shown) of the semiconductor apparatus 1.

The protection NMOS 7 is placed on the −X side of the output pad 6. Furthermore, the output NMOS 5 is placed on the +Y side of the output pad 6. As viewed from the upper surface side, the protection NMOS 7 and the NMOS 5 are each illustratively shaped like a rectangle. The protection NMOS 7 and the NMOS 5 are formed in the upper surface of the silicon substrate 15 and the lower portion of the multilevel interconnect layer of the semiconductor apparatus 1. The internal circuit 2 is also formed in the upper surface of the silicon substrate 15 and the lower portion of the multilevel interconnect layer.

The line 11, made of a rectangular metal film, is placed in the region including the directly overlying area of the protection NMOS 7. The line 11 is connected to the output pad 6 and extends out from the −X-side edge of the output pad 6 to the −X direction. Furthermore, a contact is formed between the line 11 and the protection NMOS 7 and constitutes the line 13. For simplicity of the figure, FIG. 3 schematically shows only one contact (line 13), but a plurality of contacts are formed in practice.

Furthermore, the line 12, made of a metal film, is connected between the line 11 and the output NMOS 5. The line 12 is once extracted from the −X-side portion of the +Y-side edge of the metal film constituting the line 11 to the +Y direction to enter the directly overlying area of the internal circuit 2, is bent at a bend 12a generally at a right angle to the −X direction to extend in the directly overlying area of the internal circuit 2 to the −X direction, is bent at a bend 12b generally at a right angle to the +Y direction to extend in the directly overlying area of the internal circuit 2 to the +Y direction, is bent at a bend 12c generally at a right angle to the +X direction to extend in the directly overlying area of the internal circuit 2 to the +X direction, and leaves the directly overlying area of the internal circuit 2 to reach the directly overlying area of the NMOS 5. The line 12 is then connected to the drain of the NMOS 5 through a contact 12d.

Thus the line 12 made of a metal film is split from the line 11, then passes through the inside of the region including the internal circuit 2, and reaches the NMOS 5. The line 12 thereby connects the output pad 6 to the NMOS 5. The line 12 is bent three times at the bends 12a, 12b, and 12c, thereby detoured in the region including the internal circuit 2 to acquire a high resistance. The resistance imparted to the line 12 is represented as a resistance R in FIG. 1. The line 12 has a higher resistance than the line 13 made of a contact. Consequently, the line extending from the output pad 6 to the NMOS 5 has a higher resistance than the line extending from the output pad 6 to the protection NMOS 7.

Next, the operation and effect of the present embodiment are described.

To describe the operation and effect of the present embodiment, a semiconductor apparatus according to a comparative example is described in advance.

Figure 4:
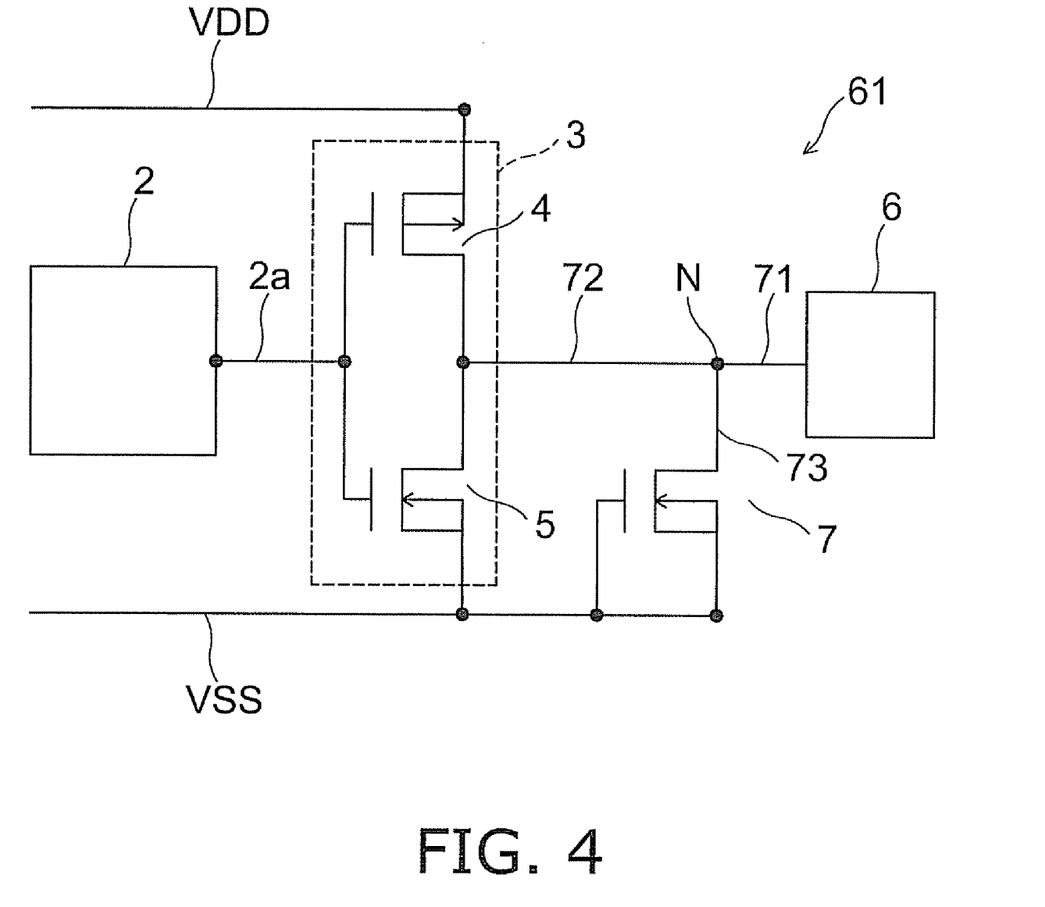
FIG. 4 is a circuit diagram illustrating a semiconductor apparatus according to the comparative example.

FIG. 4 is a circuit diagram illustrating this semiconductor apparatus.

Figure 5:
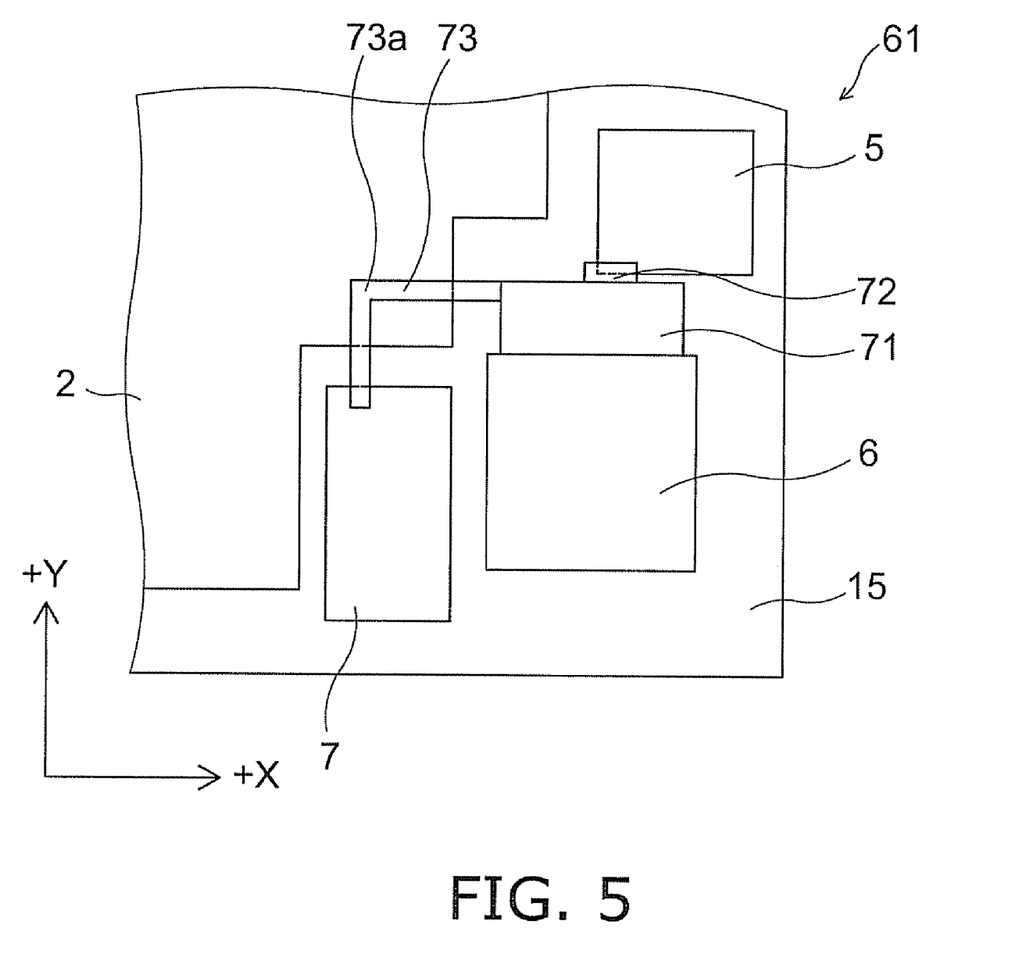
FIG. 5 is a plan view illustrating the semiconductor apparatus according to the comparative example.

FIG. 5 is a plan view illustrating the semiconductor apparatus according to this comparative example.

As shown in FIG. 4, the semiconductor apparatus 61 according to this comparative example is different from the semiconductor apparatus 1 according to the present embodiment (see FIG. 1) in that the resistance R is not added to the current path extending from the output pad 6 to the output NMOS 5. The remaining configuration of the semiconductor apparatus 61 is the same as that of the semiconductor apparatus 1 described above.

The above difference in the equivalent circuit of the semiconductor apparatuses 1 and 61 results from the difference in the layout of the semiconductor apparatuses. More specifically, as shown in FIG. 5, the semiconductor apparatus 61 according to this comparative example includes lines 71 to 73, instead of the lines 11 to 13 (see FIG. 3), to connect the output pad 6 to the NMOS 5 and the protection NMOS 7.

The line 71 is made of a rectangular metal film and extracted from the +Y-side edge of the output pad 6 to the +Y direction. The width of the line 71 is generally equal to the width of the output pad 6, and the line 71 is a wide and short interconnect. The line 72 is made of a rectangular metal film narrower and shorter than the line 71, is extracted from the +Y-side edge to the further +Y-side, and directly reaches the directly overlying area of the NMOS 5. The line 72 is then connected to the drain of the NMOS 5 through a contact (not shown). The line 72 has a shorter length than the line 12 (see FIG. 3), and hence has a lower resistance than the line 12. Thus the lines 71 and 72 linearly extend from the output pad 6 to the NMOS 5 without entering the directly overlying area of the internal circuit 2, thereby connecting the output pad 6 to the NMOS 5 at a minimum distance.

Furthermore, the line 73 is formed from an L-shaped metal film. The line 73 is extracted from the +Y-side portion of the −X-side edge of the line 71 to the −X direction, is bent at a bend 73a generally at a right angle to the −Y direction to extend to the −Y direction, and reaches the directly overlying area of the protection NMOS 7. The line 73 is then connected to the drain of the protection NMOS 7 through a contact (not shown).

Next, the operation of the semiconductor apparatus 1 according to the present embodiment configured as above is described in comparison with the operation of the semiconductor apparatus 61 according to the comparative example.

In the following description, the "output NMOS path" refers to the entire current path shown in FIGS. 1 and 5 extending from the output pad 6 through the line 11, the node N, the line 12, the resistance R, and the NMOS 5 to the low-potential power supply line VSS. The "protection NMOS path" refers to the entire current path extending from the output pad 6 through the line 11, the node N, and the protection NMOS 7 to the low-potential power supply line VSS.

Figure 6:
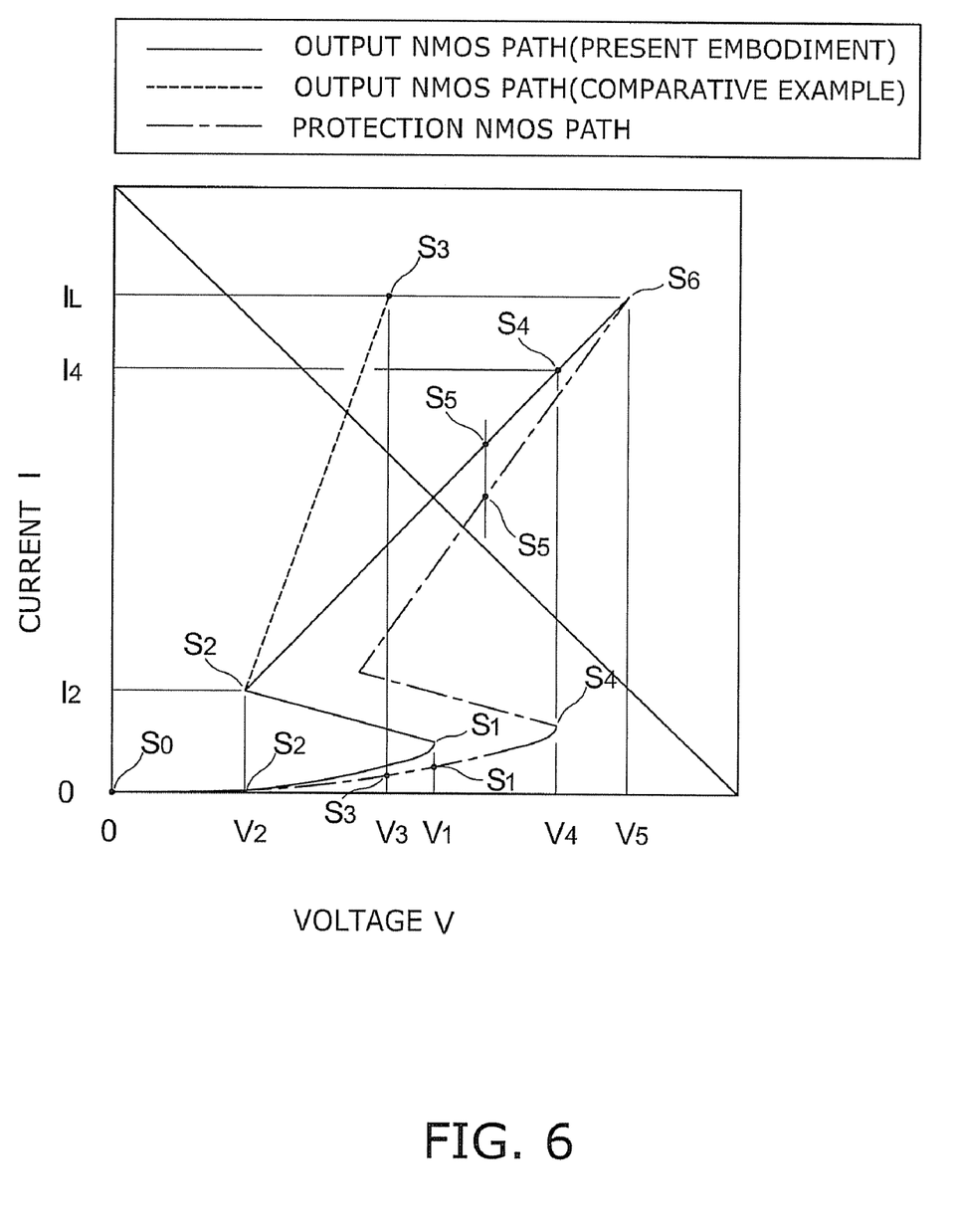
FIG. 6 is a graph illustrating the operating characteristics of the output NMOS path and the protection NMOS path.

FIG. 6 is a graph illustrating the operating characteristics of the output NMOS path and the protection NMOS path, where the horizontal axis represents voltage V between the output pad and the low-potential power supply line, and the vertical axis represents current I flowing through each of the output NMOS path and the protection NMOS path.

Figure 7:
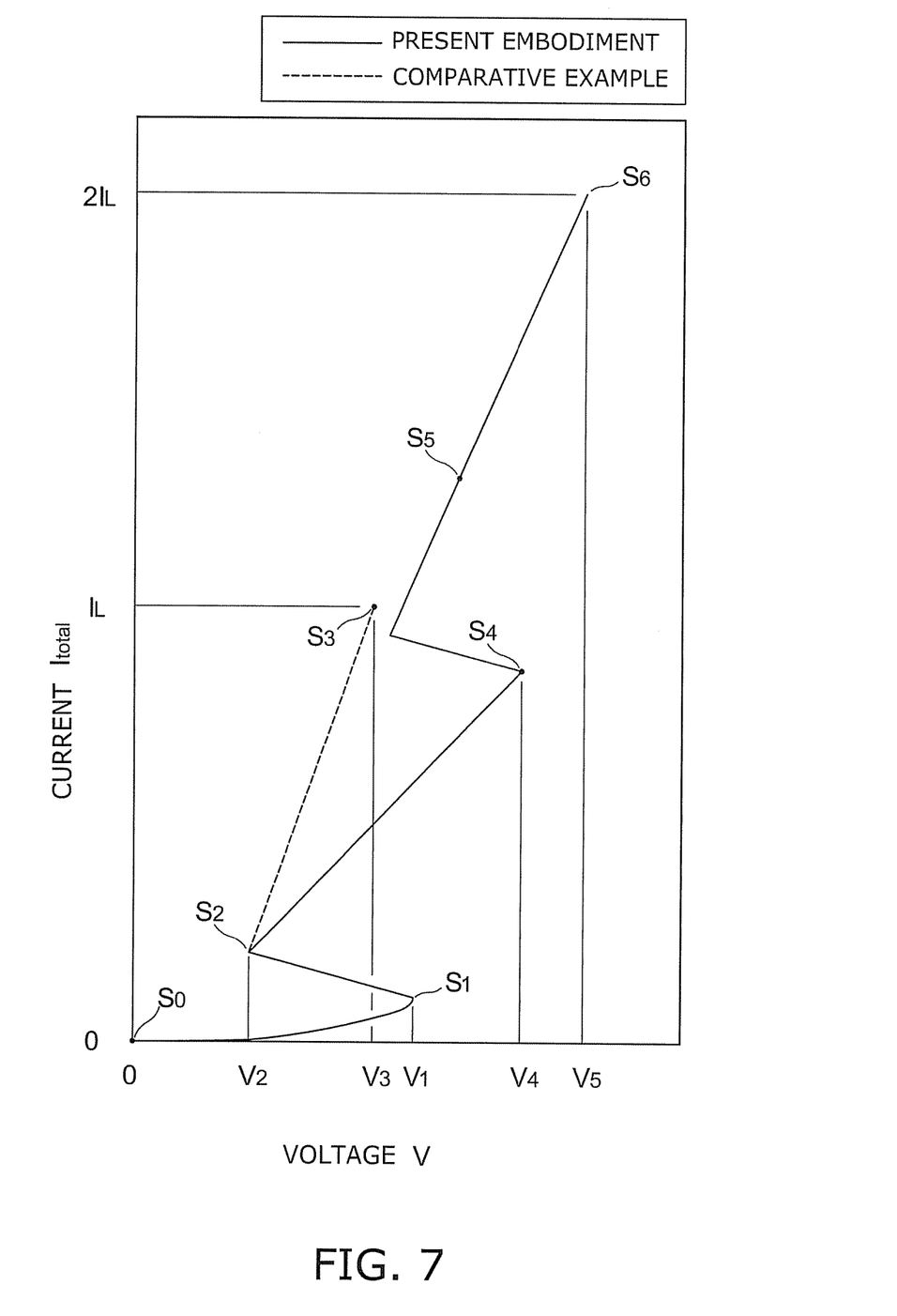
FIG. 7 is a graph illustrating the operating characteristics of the semiconductor apparatuses.

FIG. 7 is a graph illustrating the operating characteristics of the semiconductor apparatuses, where the horizontal axis represents voltage V between the output pad and the low-potential power supply line, and the vertical axis represents total current $I_{total}$ flowing through the output NMOS path and the protection NMOS path.

That is, FIG. 6 shows the operating characteristics of each of the output NMOS path and the protection NMOS path, and FIG. 7 shows the operating characteristics of a circuit in which these paths are connected in parallel. The graph shown in FIG. 7 can be obtained by characterizing the semiconductor apparatus 1 using a TLP (transmission line pulse) tester, for example. In FIG. 6, the operating characteristic of the output NMOS path of the present embodiment is represented by a solid line, and the operating characteristic of the output NMOS path of the comparative example is represented by a dashed line. The operating characteristic of the protection NMOS path is represented by a dot-dashed line. In FIG. 7, the operating characteristic of the semiconductor apparatus according to the present embodiment is represented by a solid line, and the operating characteristic of the semiconductor apparatus according to the comparative example is represented by a dashed line.

In FIGS. 6 and 7, $V_1$ denotes the value of voltage V at which the NMOS 5 causes snapback, and $V_4$ denotes the value of voltage V at which the protection NMOS 7 causes snapback. Furthermore, $I_L$ denotes the magnitude of current at which the NMOS 5 causes breakdown, and also denotes the magnitude of current at which the protection NMOS 7 causes breakdown. Because the gate of the NMOS 5 is subjected to an indefinite potential between the VDD potential and the VSS potential by the internal circuit 2, the snapback voltage $V_1$ of the NMOS 5 is lower than the snapback voltage $V_4$ of the protection NMOS 7.

The operating characteristic of the output NMOS path differs between the present embodiment and the comparative example. More specifically, because the output NMOS path of the present embodiment includes a resistance R, the ratio of current increase to voltage increase for the present embodiment is smaller than that for the comparative example. Hence, in FIG. 6, the slope of the V-I graph for the present embodiment is smaller than that for the comparative example. On the other hand, the operation of the protection NMOS 7 of the present embodiment is the same as that of the comparative example. Consequently, in the comparative example, the value of voltage V at which the breakdown current $I_L$ flows through the NMOS 5, $V_3$, is lower than the snapback voltage $V_4$ of the protection NMOS 7. In contrast, in the present embodiment, the voltage at which the breakdown current $I_L$ flows through the NMOS 5 is higher than the snapback voltage $V_4$ of the protection NMOS 7, and illustratively equal to the voltage $V_5$ at which the breakdown current $I_L$ flows through the protection NMOS 7. In other words, the current $I_4$ flowing through the output NMOS path upon application of the snapback voltage $V_4$ of the protection NMOS 7 to the output NMOS path is lower than the breakdown current $I_L$ of the NMOS 5.

Thus, when the voltage V applied between the output pad 6 and the low-potential power supply line VSS is continuously increased, the semiconductor apparatus exhibits the following behavior. For convenience, the states of each path at various points in the following description are indicated by states $S_0$ to $S_6$ in FIGS. 6 and 7.

First, the operation of the semiconductor apparatus 61 according to the comparative example is described.

When no voltage is applied between the output pad 6 and the low-potential power supply line VSS, the voltage V equals 0, and the current I also equals 0 (state $S_0$). In this state, ESD is applied illustratively to the output pad 6 to increase the voltage V. When the voltage V reaches $V_1$ (state $S_1$), the NMOS 5 causes snapback. This allows a current to flow through the output NMOS path, and the voltage V decreases to $V_2$. The magnitude of the current I at this time is denoted by $I_2$. On the other hand, at this time, because the protection NMOS 7 does not cause snapback, little current flows through the protection NMOS path (state $S_2$).

As the voltage V further increases, the current flowing through the output NMOS path also increases. At this time, the current flowing through the protection NMOS path also increases, but only slightly, because the protection NMOS 7 has not caused snapback. Then, when the voltage V reaches the voltage $V_3$, a current $I_L$ flows through the output NMOS path, and the NMOS 5 causes breakdown. On the other hand, even at this stage, the voltage V does not reach $V_4$, and hence the protection NMOS 7 does not cause snapback. Thus, little current flows through the protection NMOS path (state $S_3$). Hence, in the semiconductor apparatus 61 according to the comparative example, the ESD capability between the output terminal 6 and the low-potential power supply line VSS is almost determined by the characteristics of the NMOS 5, and the protection effect of the protection NMOS 7 is scarcely utilized.

Next, the operation of the semiconductor apparatus 1 according to the present embodiment is described.

Also in the semiconductor apparatus 1 according to the present embodiment, the operation from the state $S_0$ to the state $S_2$ is the same as the operation of the semiconductor apparatus 61 according to the comparative example described above. Then, when the voltage V increases from the state $S_2$ and reaches the voltage $V_4$, the protection NMOS 7 also causes snapback, allowing a current to flow also through the protection NMOS path (state $S_4$). Subsequently, even when the voltage V further increases, the current flows through both the output NMOS path and the protection NMOS path (state $S_5$), hence exhibiting a low overall resistance. Consequently, the ESD current applied to the output pad 6 can be effectively passed to the low-potential power supply line VSS. Ideally, the semiconductor apparatus 1 does not cause breakdown until the state (state $S_6$) where the breakdown current $I_L$ flows through each of the output NMOS path and the protection NMOS path when the voltage reaches $V_5$.

In the following, the magnitude of the resistance R for achieving the above operation is quantitatively described.

The on-resistance of the output NMOS 5 is denoted by $R_{NMOS\text{-}ON}$, and the on-resistance of the overall output NMOS path is denoted by $R_{ON}$. It is noted that the magnitude of the resistance added by the line 12 is R. Then the following formula (1) holds:

$$R_{ON} = R + R_{NMOS\text{-}ON} \quad (1)$$

As described above, the current $I_4$ flowing through the output NMOS path upon application of the snapback voltage $V_4$ of the protection NMOS 7 to the output NMOS path needs to be lower than the breakdown current $I_L$ of the NMOS 5. Hence the following formula (2) holds:

$$I_L > I_4 \quad (2)$$

On the other hand, the magnitude of the resistance $R_{ON}$ is the inverse of the slope of the line segment connecting between the state $S_2$ and the state $S_6$ in FIG. 6. Hence the following formula (3) holds from FIG. 6. The above formulas (2) and (3) yield the following formula (4), which can be rewritten as the following formula (5):

$$I_4 = \frac{V_4 - V_2}{R_{ON}} + I_2 \quad (3)$$

$$I_L > \frac{V_4 - V_2}{R_{ON}} + I_2 \quad (4)$$

$$R_{ON} > \frac{V_4 - V_2}{I_L - I_2} \quad (5)$$

Hence the on-resistance $R_{ON}$ of the overall output NMOS path can be suitably selected as long as the above formula (5) is satisfied. Furthermore, the above formulae (1) and (5) yield the following formula (6). Hence the resistance R realized by the line can be suitably selected as long as the following formula (6) is satisfied:

$$R > \frac{V_4 - V_2}{I_L - I_2} - R_{NMOS\text{-}ON} \quad (6)$$

Next, the effect of the present embodiment is described.

As described above, in the present embodiment, the protection NMOS 7 is operable to cause snapback before the output NMOS 5 causes breakdown. Hence a current can be passed in parallel through both the output NMOS path and the protection NMOS path. Consequently, the semiconductor apparatus 1 according to the present embodiment achieves a high ESD capability.

Furthermore, in the present embodiment, addition of a resistance R to the output NMOS path is based on a detoured line. Hence, in contrast to conventional semiconductor apparatuses, there is no need to change the design of active devices such as MOSFETs. Hence no variation occurs in the characteristics of active devices, facilitating the design thereof. Furthermore, the line is detoured in the region of the internal circuit 2. Hence there is no need to prepare a region dedicated to detouring the line, and the chip size does not increase.

It is contemplated that, as an alternative method for improving ESD capability, the total area of the drain-source region (the N-type region 19 shown in FIG. 2A) in the NMOS 5 can be increased to reduce the density of ESD current. However, this method results in increasing the area of the NMOS 5 and increasing the chip size. As another method, the drain-source spacing of the NMOS 5 can be increased to increase the snapback voltage $V_1$ of the NMOS 5. However, this method also results in increasing the area of the NMOS 5. Furthermore, unfortunately, these methods result in varying the characteristics of the output NMOS 5 such as current driving performance and parasitic capacitance, and affecting the overall characteristics of the semiconductor apparatus 1.

As still another method, the snapback voltage $V_4$ of the protection NMOS 7 can be made lower than the snapback voltage $V_1$ of the output NMOS 5 to allow only the protection NMOS 7 to cause snapback, thereby protecting the NMOS 5. However, in this case, the flow of ESD current is limited to the protection NMOS path, decreasing the total amount of allowable ESD current. As still another method, a polysilicon layer can be interposed between the output pad 6 and the NMOS 5 to implement a resistance R. However, in this case, the region needed to place a polysilicon layer increases the chip size.

In contrast, according to the present embodiment, the ESD capability can be significantly improved without increasing the chip size and without varying the characteristics of the output MOSFET. Thus the present embodiment can provide a semiconductor apparatus that can reliably protect the output CMOS circuit from ESD.

In the present embodiment, the line 12 is detoured by being bent three times. However, the invention is not limited thereto. For example, the number of bends can be two. Specifically, in FIG. 3, the line 12 can be extracted from the −X-side edge of the line 11 to the −X direction, bent at a right angle to extend to the +Y direction, bent once again at a right angle to extend to the +X direction, and allowed to reach the directly overlying area of the NMOS 5. Alternatively, the number of bends can be four or more.

Alternatively, a resistance R can be added without detouring the line 12. For example, a desired resistance can be imparted to the line 12 by narrowing its width or thinning its thickness. Furthermore, the output NMOS 5 can be placed distant from the output pad 6 and the protection NMOS 7 to increase the length of the line 12 so that a desired resistance is imparted to the line 12 without specially designing the width and thickness of the line 12. On the other hand, as described above, by bending the line 12 twice or more to detour it, a desired resistance is imparted to the line 12 without specially designing the width and thickness of the line 12 and without distancing the NMOS 5 from the output pad 6 and the protection NMOS 7.

In the following, an example effect of the present embodiment is specifically described.

The configuration of a semiconductor apparatus according to this specific example is the same as that of the present embodiment described above. In this semiconductor apparatus, in the configuration before addition of the resistance R (see FIG. 4), the on-resistance $R_{ON}$ of the overall output NMOS path was $1.85\Omega$. On the other hand, by calculation based on the slope of the line segment connecting between the state $S_2$ and the state $S_6$ in FIG. 6, a resistance of $2.14\Omega$ or more was required for the on-resistance $R_{ON}$ to satisfy the above formula (5). In this case, if a resistance R of $0.33\Omega$ is added to the output NMOS path, the magnitude of the on-resistance $R_{ON}$ becomes $1.85+0.33=2.18\Omega$, which is higher than $2.14\Omega$. Thus, in this specific example, a metal line having a sheet resistance of $0.03\Omega/\square$, a width of $20\,\mu m$, and a length of $200\,\mu m$ was interposed between the node N and the NMOS 5. Consequently, the ESD capability of the machine model was increased from 170 V to 340 V. It is noted that, in this specific example, there was no design change in the NMOS 5, and hence no change in the characteristics of the NMOS 5. Furthermore, although the layout of the metal line is changed, it causes no increase in chip size.

Next, a second embodiment of the invention is described.

Figure 8:
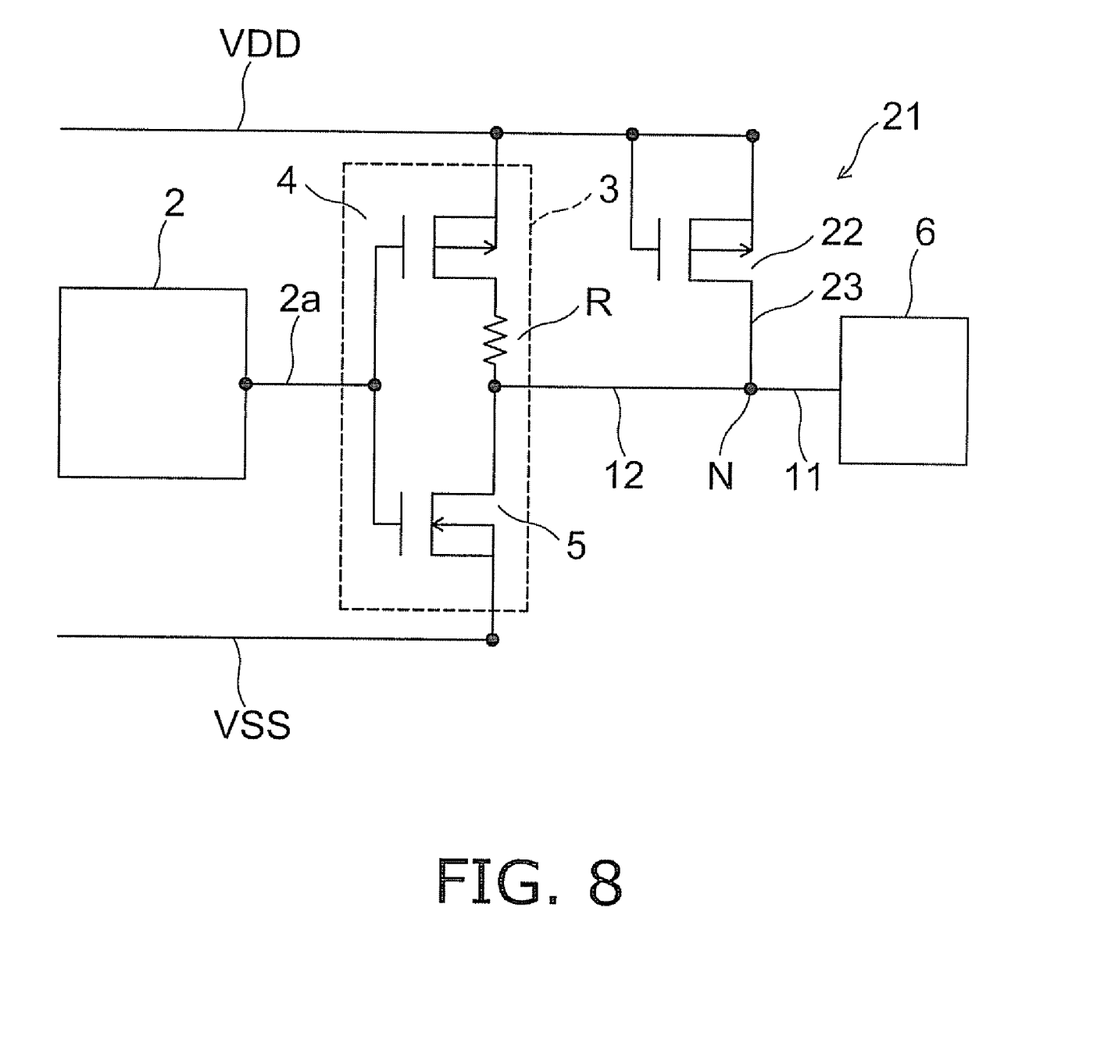
FIG. 8 is a circuit diagram illustrating a semiconductor apparatus according to a second embodiment of the invention.

FIG. 8 is a circuit diagram illustrating a semiconductor apparatus according to the present embodiment.

As shown in FIG. 8, the semiconductor apparatus 21 according to the present embodiment includes a protective P-channel MOSFET (hereinafter referred to as "protection PMOS") 22. The source and the gate of the protection PMOS 22 are connected to the high-potential power supply line VDD, and its drain is connected to the output pad 6 through lines 23 and 11. More specifically, the line 11 extracted from the output pad 6 is split at the node N into the line 12 and the line 23. The line 12 is connected to the drain of the PMOS 4 and the drain of the NMOS 5, and the line 23 is connected to the drain of the protection PMOS 22. Thus the protection PMOS 22 is connected in parallel to the PMOS 4 between the output pad 6 and the high-potential power supply line VDD. By detouring the line 12, a resistance R is added between the node N and the output PMOS 4. According to the present embodiment, the PMOS 4 can be protected from ESD applied to the output pad 6. The configuration, operation, and effect of the present embodiment other than the foregoing are the same as those of the above first embodiment.

Next, a third embodiment of the invention is described.

Figure 9:
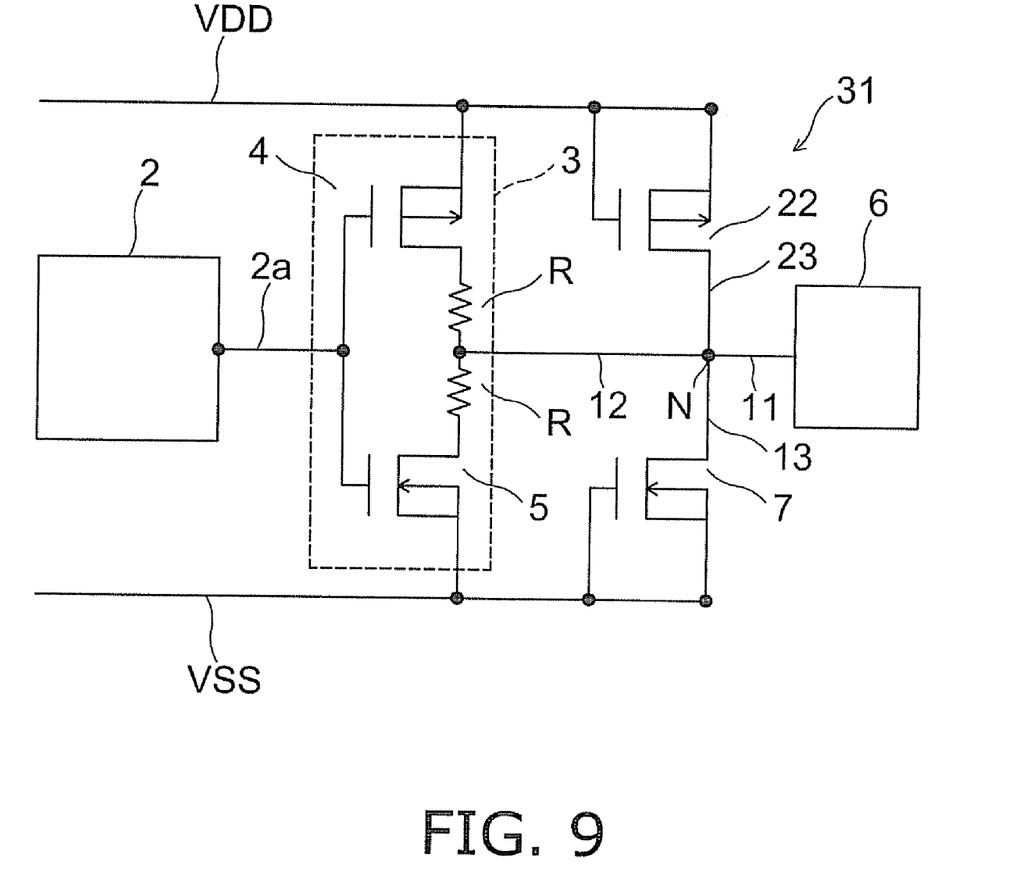
FIG. 9 is a circuit diagram illustrating a semiconductor apparatus according to a third embodiment of the invention.

FIG. 9 is a circuit diagram illustrating a semiconductor apparatus according to the present embodiment.

As shown in FIG. 9, the semiconductor apparatus 31 according to the present embodiment includes both a protection NMOS 7 and a protection PMOS 22. The configuration and connection of the protection NMOS 7 and the protection PMOS 22 are the same as those of the above first or second embodiment. By detouring the line 12, resistances R are added between the node N and the NMOS 5 and between the node N and the PMOS 4, respectively. According to the present embodiment, both the NMOS 5 and the PMOS 4 can be protected from ESD. The configuration, operation, and effect of the present embodiment other than the foregoing are the same as those of the above first embodiment.

The invention has been described with reference to the embodiments. However, the invention is not limited to these embodiments. For example, the above embodiments can be suitably modified through addition, deletion, and/or design change of the components by those skilled in the art without departing from the spirit of the invention, and any such modifications are also encompassed within the scope of the invention.

The invention claimed is:

1. A semiconductor apparatus comprising:
   an internal circuit;
   a CMOS composed of a P-channel MOS transistor with a source connected to a high-potential power supply line and a gate connected to the internal circuit, and an N-channel MOS transistor with a source connected to a low-potential power supply line and a gate connected to the internal circuit;
   an output terminal connected to a drain of the P-channel MOS transistor and a drain of the N-channel MOS transistor; and
   a protection transistor with a source and a gate connected to the high-potential power supply line and a drain connected to the output terminal, a conductivity type of the protection transistor being an P-channel type,
   resistance of a current path extending from the output terminal through the P-channel MOS transistor to the high-potential power supply line having a value such that, when voltage at which the protection transistor causes snapback is applied between the output terminal and the high-potential power supply line, a current flowing through the current path is lower than a breakdown current of the P-channel MOS transistor, a line connecting the output terminal to the P-channel MOS transistor passing through the inside of a region including the internal circuit, and resistance of a line connecting the output terminal to the P-channel MOS transistor being higher than resistance of a line connecting the output terminal to the protection transistor.

2. The semiconductor apparatus according to claim 1, wherein the line connecting the output terminal to the P-channel MOS transistor has two or more bends.

3. The semiconductor apparatus according to claim 1, wherein the line connecting the output terminal to the P-channel MOS transistor has three or more bends.

4. The semiconductor apparatus according to claim 1, wherein a drain-source spacing in the P-channel MOS transistor is smaller than a drain-source spacing in the protection transistor.

5. The semiconductor apparatus according to claim 1, wherein the line connecting the output terminal to the P-channel MOS transistor passes through a region including a directly overlying area of the protection transistor.

* * * * *